(12) United States Patent
Kim et al.

(10) Patent No.: US 10,530,121 B2
(45) Date of Patent: Jan. 7, 2020

(54) LIGHTING APPARATUS WITH IMPROVED COLOR DEVIATION

(71) Applicant: LG INNOTEK CO., LTD., Seoul (KR)

(72) Inventors: Won Jin Kim, Seoul (KR); Ju Yeon Won, Seoul (KR); In Jae Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 154 days.

(21) Appl. No.: 15/488,636

(22) Filed: Apr. 17, 2017

(65) Prior Publication Data

US 2017/0307176 A1    Oct. 26, 2017

(30) Foreign Application Priority Data

Apr. 25, 2016    (KR) .................. 10-2016-0050209

(51) Int. Cl.
| | |
|---|---|
| *F21S 41/16* | (2018.01) |
| *H01S 5/00* | (2006.01) |
| *F21K 9/64* | (2016.01) |
| *F21V 9/08* | (2018.01) |

(52) U.S. Cl.
CPC ................ *H01S 5/005* (2013.01); *F21K 9/64* (2016.08); *F21V 9/08* (2013.01)

(58) Field of Classification Search
CPC .... F21S 414/14; F21S 414/143; F21S 414/16; F21K 9/64; H01S 5/0078; F21Y 2115/30; G03B 21/204; H01L 33/505; H01L 33/507

See application file for complete search history.

(56) References Cited

U.S. PATENT DOCUMENTS

| | | | | |
|---|---|---|---|---|
| 2004/0247242 | A1* | 12/2004 | Blasingame | G02B 6/4207 385/35 |
| 2006/0279950 | A1* | 12/2006 | Hama | A61B 1/0653 362/257 |
| 2008/0075406 | A1 | 3/2008 | Kadomi et al. | |
| 2008/0116473 | A1* | 5/2008 | Sugiyama | H01L 33/483 257/98 |
| 2008/0123339 | A1 | 5/2008 | Bierhuizen et al. | |
| 2012/0170602 | A1* | 7/2012 | Hikmet | C09K 11/7731 372/31 |

(Continued)

FOREIGN PATENT DOCUMENTS

| | | |
|---|---|---|
| WO | 2012/108291 A1 | 8/2012 |
| WO | 2017/040433 A1 | 3/2017 |

OTHER PUBLICATIONS

European search report for European Patent Application No. 17167351.0, dated Sep. 25, 2017 corresponding to the above-referenced U.S. application.

*Primary Examiner* — Bao Q Truong
*Assistant Examiner* — Steven Y Horikoshi
(74) *Attorney, Agent, or Firm* — LRK Patent Law Firm (57) ABSTRACT

A lighting apparatus includes: a light source configured to generate laser beams; a light converter disposed in a direction in which the laser beams are emitted and configured to generate converted beams excited by the laser beams and transmitted beams of the laser beams; and a light housing disposed in front of the light converter, having an opening along a path of beam travel, and configured to adjust a light distribution of the converted beams.

8 Claims, 5 Drawing Sheets

(56) References Cited

U.S. PATENT DOCUMENTS

| | | | |
|---|---|---|---|
| 2013/0126918 A1* | 5/2013 | Hsieh | H01L 33/505 257/89 |
| 2014/0293631 A1 | 10/2014 | Lee | |
| 2015/0055348 A1 | 2/2015 | Ha et al. | |
| 2015/0109806 A1 | 4/2015 | Ahn et al. | |
| 2015/0372198 A1* | 12/2015 | Daicho | H01L 33/507 372/44.01 |
| 2016/0004147 A1* | 1/2016 | Hu | H04N 9/315 362/84 |
| 2016/0091171 A1* | 3/2016 | Okada | F21V 3/061 372/44.01 |

* cited by examiner

LIGHTING APPARATUS WITH IMPROVED COLOR DEVIATION

CROSS-REFERENCE TO RELATED APPLICATION

This application claims priority to and the benefit of Korean Patent Application No. 2016-0050209, filed on Apr. 25, 2016, the disclosure of which is incorporated herein by reference in its entirety.

BACKGROUND

1. Field of the Invention

The present invention relates to a lighting apparatus, and more particularly, to a lighting apparatus which is used for a vehicle lamp and the like.

2. Description of Related Art

With the recent expansion of the electric vehicle and hybrid electric vehicle market, designed light sources which do not use filaments are being actively developed for low-power and high-efficiency vehicles.

However, since the low-power and high-efficiency beam sources use low-wavelength beam sources which emit beams in a relatively narrow spectral width, the beams should be converted into white beams using a phosphor for a practical use, and thus a reliability problem can occur in that the phosphor can be changed and degraded by the high temperature/high intensity low-wavelength beams during such a conversion process. To solve such a problem, a need for research about a phosphor which can be disposed spaced apart from a light source exists.

Such a phosphor has an advantage of improving reliability, but there is a problem in that beam efficiency is decreased due to a characteristic in which converted beams are emitted in all directions, and thus, an improvement is required.

SUMMARY OF THE INVENTION

The present invention is directed to a lighting apparatus capable of improving a color deviation by adjusting a light distribution region of converted beams converted by a phosphor.

In addition, the present invention is also directed to a lighting apparatus capable of adjusting a radiation angle of white beams emitted therefrom.

According to an aspect of the present invention, there is provided a lighting apparatus including: a light source configured to generate laser beams; a light converter disposed in a direction in which the laser beams are emitted and configured to generate converted beams excited by the laser beams and transmitted beams of the laser beams; and a light housing disposed in front of the light converter, having an opening along a path of beam travel, and configured to adjust a light distribution of the converted beams.

A diameter of the opening of the light housing may increase in a direction in which the converted beams and the transmitted beams are emitted.

The light housing may adjust a light distribution region of the converted beams toward a light distribution region of the transmitted beams.

The light distribution region of the converted beams may follow a Lambertian distribution, and the light distribution region of the transmitted beams may follow a Gaussian distribution.

The light housing may block converted beams of a region excluded in the light distribution region of the transmitted beam within the light distribution region of the converted beams.

A diameter of a first opening of one end, which is in contact with the light converter, of the light housing may be determined according to an incident area of the laser beams.

A ratio of the incident area of the laser beams to the diameter of the first opening may be 1:3.75.

An inclination angle of the opening of the light housing may be determined according to a directional angle of white beams emitted from the light converter.

The inclination angle of the opening of the light housing may be in the range of 15° to 45°.

A cross section of the opening of the light housing may have a circular, oval, or polygonal shape.

The cross section of the opening of the light housing may have a symmetrical shape with respect to a central axis of the laser beams.

The cross section of the light housing opening may have an asymmetrical shape with respect to a central axis of the laser beams.

The shape of the cross section of the opening of the light housing may be determined according to a central axis of the laser beams and a directional angle of white beams emitted from the light converter.

the light converter may include a substrate, a short wavelength filter disposed on the substrate, and a phosphor disposed on the short wavelength filter and in contact with one end of the light housing.

The lighting apparatus may further include an adhesive layer disposed between the short wavelength filter and the phosphor.

The lighting apparatus may further include a mold layer disposed along peripheries of the phosphor and the adhesive layer.

A cross-sectional area of the phosphor may be greater than that of one end of the light housing.

According to another aspect of the present invention, there is provided a lighting apparatus including: a light source configured to generate laser beams; a light converter disposed in a direction in which the laser beams are emitted and configured to generate converted beams excited by the laser beams and transmitted beams of the laser beam; a light housing disposed in front of the light converter, having an opening along a path of beam travel, and configured to adjust a light distribution of the converted beams; and a collimator disposed between the light source and the light converter and configured to emit the laser beams as parallel beams.

The lighting apparatus may further include a light collector disposed between the collimator and the light converter and configured to collect the parallel beams.

A diameter of a first opening of one end, which is in contact with the light housing, of the light converter may be determined according to an incident area of laser beams output from the light collector.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

While the invention may be modified in various ways and take on various alternative forms, specific embodiments thereof are shown in the drawings and described in detail below as examples. However, it should be understood that there is no intent to limit the invention to the particular forms disclosed and that the invention covers all modifications, equivalents, and alternatives falling within the spirit and scope of the appended claims.

Although terms including ordinal terms such as "first," "second," etc. may be used herein in reference to elements of the invention, such elements are not to be construed as limited by these terms. These terms are only used to distinguish one element from another. For example, a first element could be termed a second element and a second element could be termed a first element without departing from the scope of the present invention. Herein, the term "and/or" includes any and all combinations of one or more referents.

It should be understood that when an element is referred to as being "connected" or "coupled" to another element, the element can be directly connected or coupled to the other element, or intervening elements may be present therebetween. In contrast, when an element is referred to as being "directly connected" or "directly coupled" to another element, there are no intervening elements.

The terminology used herein to describe embodiments of the invention is not intended to limit the scope of the invention. The articles "a," "an," and "the" are singular in that they have a single referent, however the use of the singular form in the present document does not preclude the presence of a plural referent. In other words, elements of the invention referred to in the singular may number one or more unless the context clearly indicates otherwise. It should be further understood that the terms "comprise," "comprising," "include," and/or "including," when used herein, specify the presence of stated features, numbers, steps, operations, elements, and/or components, but do not preclude the presence or addition of one or more other features, numbers, steps, operations, elements, components, and/or groups thereof.

Unless otherwise defined, all terms including technical and scientific terms used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and are not to be interpreted in an idealized or overly formal sense unless expressly so defined herein.

Hereinafter, embodiments of the invention will be described in detail with reference to the accompanying drawings, and the same or corresponding elements will be consistently denoted by the same reference numerals and will not be repeatedly described regardless of the reference numerals.

Figure 1:
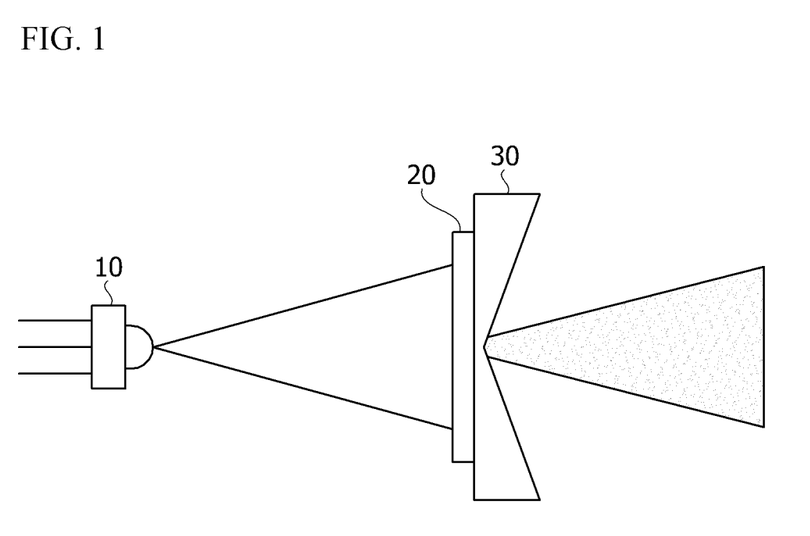
FIG. 1 is a conceptual view illustrating a lighting apparatus according to one embodiment of the present invention.
Figure 2:
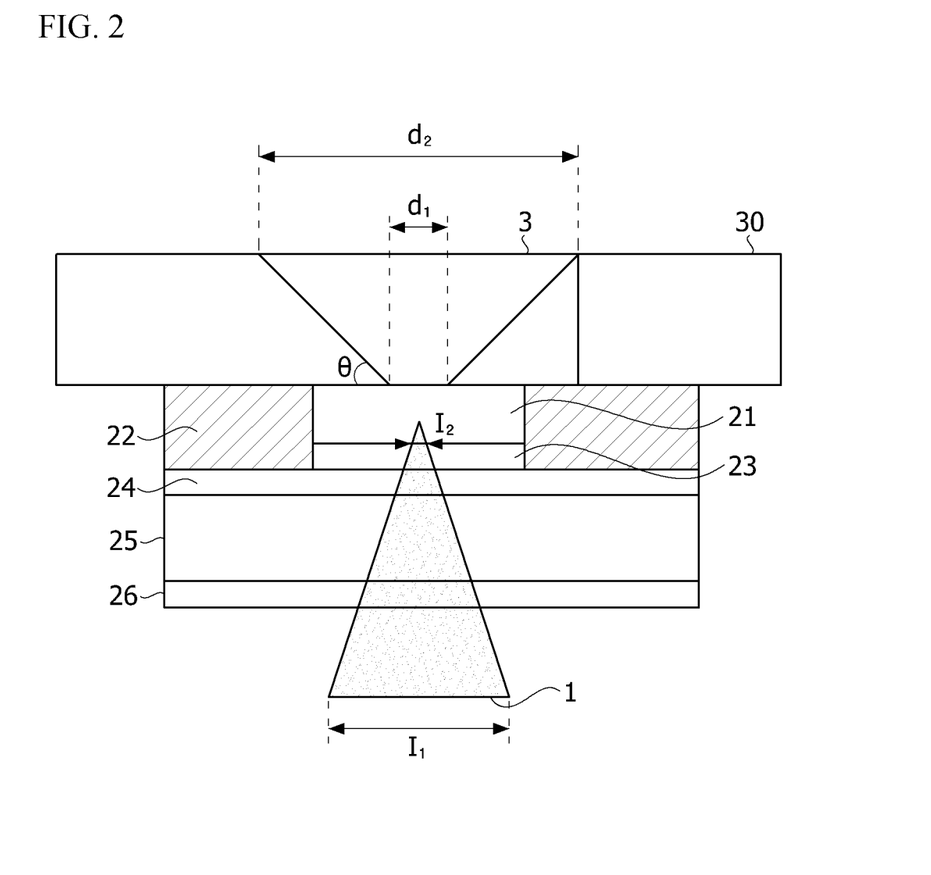
FIG. 2 is a partially enlarged cross-sectional view illustrating the lighting apparatus according to one embodiment of the present invention.

FIG. 1 is a conceptual view illustrating a lighting apparatus according to one embodiment of the present invention, and FIG. 2 is a partially enlarged cross-sectional view illustrating the lighting apparatus according to one embodiment of the present invention.

Referring to FIG. 1, the lighting apparatus according to one embodiment of the present invention may include a light source 10 configured to generate laser beams, a light converter 20 disposed in a direction in which the laser beams are emitted and configured to generate converted beams excited by the laser beams and transmitted beams of the laser beam, and a light housing 30 disposed in front of the light converter 20, having an opening along a path of beam travel, and configured to adjust a light distribution of the converted beams.

First, the light source 10 may generate laser beams in the blue wavelength range. The laser beam generated by the light source 10 may be laser beams having a wavelength of about 450 nm.

The light converter 20 is disposed in a direction in which laser beams are emitted, and may react with laser beams in the blue wavelength range which are emitted by the light source 10 to output white beams. The light converter 20 may transmit some of the laser beams in the blue wavelength range which are emitted from the light source to generate transmitted beams, and convert the remaining laser beams to generate converted beams in the yellow wavelength range. The light converter 20 generates white beams by combining the transmitted beams and the converted beams to emit the white beams through an emission surface.

The light converter 20 may include a substrate 25, a short wavelength filter 24, and a phosphor 21.

The substrate 25 may include a sapphire substrate, and an anti-reflective coating may be provided on one surface of the substrate 25 on which laser beams are incident.

The phosphor 21 may be provided on a surface in contact with the light housing 30, convert absorbed beams into beams having another wavelength, and emit the beams. The phosphor 21 converts incident laser beams into beams in the yellow wavelength range to generate converted beams, and the converted beams is combined with laser beams transmitted through the phosphor 21 to form white beams.

A cross section of the phosphor 21 may be greater than that of one end of the light housing 30.

The short wavelength filter 24 may be provided between the substrate 25 and the phosphor 21, and beams reflected to a surface except for the emission surface among beams converted by the phosphor 21 may be reflected back toward the emission surface by the short wavelength filter 24. The beams reflected back by the short wavelength filter 24 form white beams. The short wavelength filter 24 may be provided at one surface opposite a surface except for a surface in which converted beams are emitted from the phosphor 21 or the remaining surface except for a surface from which converted beams are emitted. An adhesive layer 23 may be disposed between the short wavelength filter 24 and the phosphor 21, and a mold layer 22 may be disposed along peripheries of the phosphor 21 and the adhesive layer 23.

The light housing 30 may be disposed at a side of the white beam emission surface of the light converter 20 and have a shape in which an opening is provided along the white beam emission surface of the light converter 20. The opening of the light housing 30 may have a shape in which a diameter increases in a direction in which converted beams are emitted.

In addition, the light housing 30 may block converted beams of a region excluded in a light distribution region of transmitted beams within a light distribution region of the converted beams.

Figure 3A:
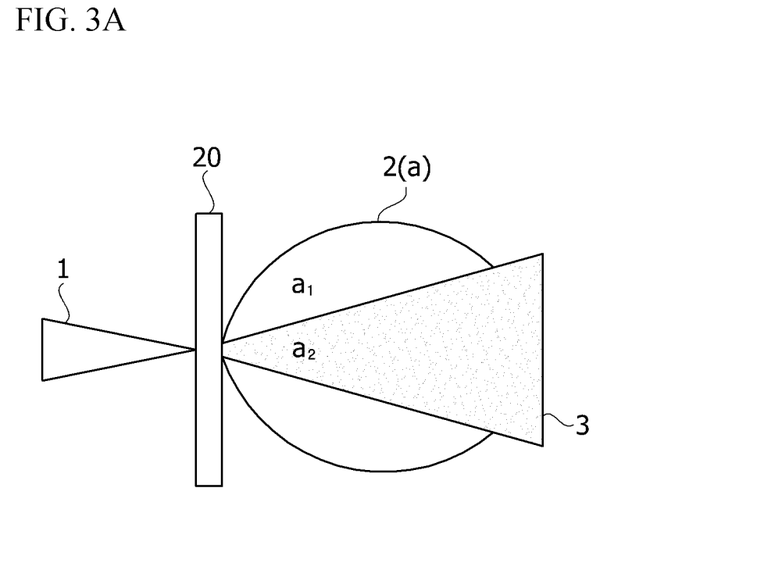
FIGS. 3A and 3B are views for describing an operation of the lighting apparatus according to one embodiment of the present invention.
Figure 3B:
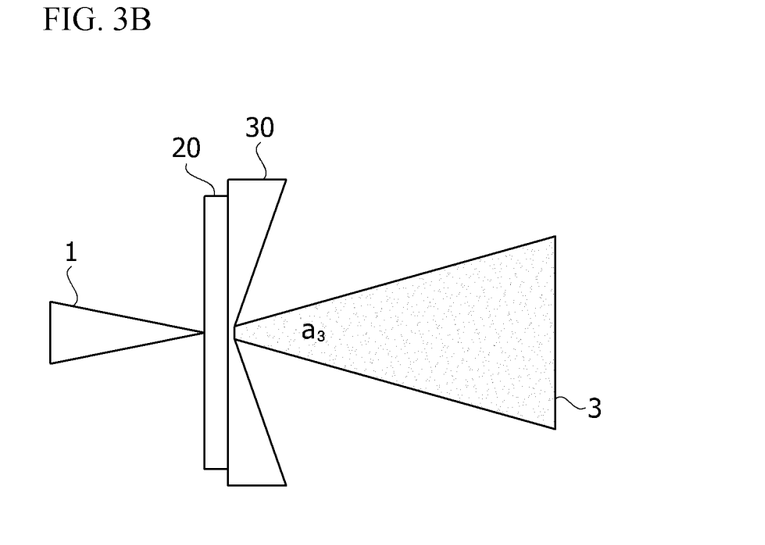

FIGS. 3A and 3B are views for describing an operation of the lighting apparatus according to one embodiment of the present invention.

The light housing 30 may adjust a light distribution region of converted beams in a direction of a light distribution region of transmitted beams which transmitted through the light converter 20. Transmitted beams in the blue wavelength range which are transmitted through the light converter 20 among laser beams incident on the light converter 20 pass through the emission surface of the light converter to form a light distribution region a2 according to a Gaussian distribution, and converted beams converted by the phosphor form a light distribution region a1 according to a Lambertian distribution. Accordingly, white beams are generated in a region in which the transmitted beams in the blue wavelength range according to the Gaussian distribution overlap the converted beams in the yellow wavelength range according to the Lambertian distribution, although beams in the yellow wavelength range are emitted in a region outside the Gaussian distribution as illustrated in FIG. 3A. Beams in such a yellow wavelength range increase an overall color deviation of the beams output from a lighting apparatus, and thus, there is a problem in that beams of an edge portion of the lighting apparatus are observed as yellow beams.

Referring to FIG. 3B, since the light housing of the lighting apparatus according to one embodiment of the present invention blocks a region which does not overlap a light distribution region of transmitted beams according to a Gaussian distribution within a light distribution region of converted beams which shows a Lambertian distribution, a light distribution region a3 of the converted beams and a light distribution region a3 of the transmitted beams are adjusted to be the same within a predetermined error range, and thus, a color deviation problem can be solved.

A diameter d1 of a first opening, which is in contact with the light converter 20, of the light housing 30 may be determined according to an incident area I2 of laser beams. That is, a light distribution region of transmitted laser beams is determined according to the incident area I2 of laser beams, and when a ratio of the incident area of the laser beams to the diameter of the first opening d1 is 1:3.75, light distribution regions of the two types of beams are the same within a predetermined error range.

In addition, an inclination angle θ of the opening of the light housing 30 may be determined according to a directional angle of white beams emitted from the light converter 20. The inclination angle θ of the opening of the light housing 30 may be determined according to an inclination angle between a central axis of laser beams and an inside of the light housing 30, and thus, a directional angle of white beams may be determined according to the inclination angle of the opening.

A cross section of the opening may have a circular or oval shape, but is not limited thereto, and may have a polygonal shape. A shape of the cross section of the opening may be determined according to a central axis of laser beams and a directional angle of white beams emitted from the light converter. That is, the cross section of the opening may have a symmetrical shape with respect to a central axis of laser beams, but when a direction in which white beams are directed is deviated from a central axis of laser beams, a cross section of the opening may have an asymmetrical shape with respect to the central axis of the laser beams.

Figure 4:
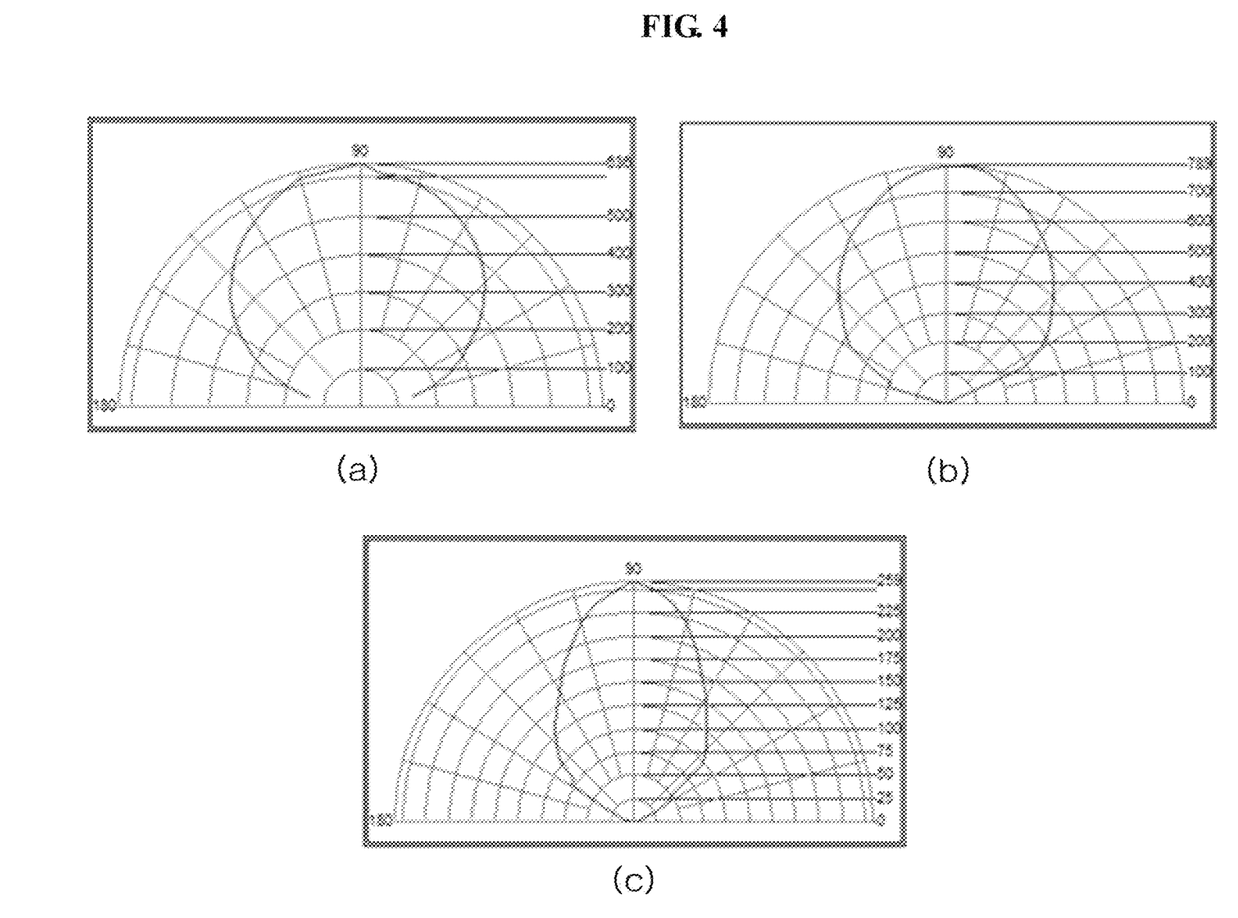
FIG. 4 is a graph for describing the operation of the lighting apparatus according to one embodiment of the present invention.

FIG. 4 is a graph for describing the operation of the lighting apparatus according to one embodiment of the present invention.

Referring to FIG. 4, (a) is a graph which shows a distribution of light emitted from a lighting apparatus in which the light housing is excluded. It is apparent from (a) of FIG. 4 that the emitted beams are distributed in all directions, and white beams mixed with beams in the yellow wavelength range are shown.

In FIG. 4, (b) is a graph which shows a distribution of light emitted from a lighting apparatus including a light housing having an opening with an inclination angle of 15°. It is apparent from (b) of FIG. 4 that beams in the yellow wavelength range are blocked by the light housing, and white beams are emitted with a relatively wide distribution.

In FIG. 4, (c) is a graph which shows a distribution of light emitted from a lighting apparatus including a light housing having an opening with an inclination angle of 30°. It is apparent from (c) of FIG. 4 that beams in the yellow wavelength range are blocked by the light housing, and the white beams are emitted with a relatively narrow distribution.

Figure 5:
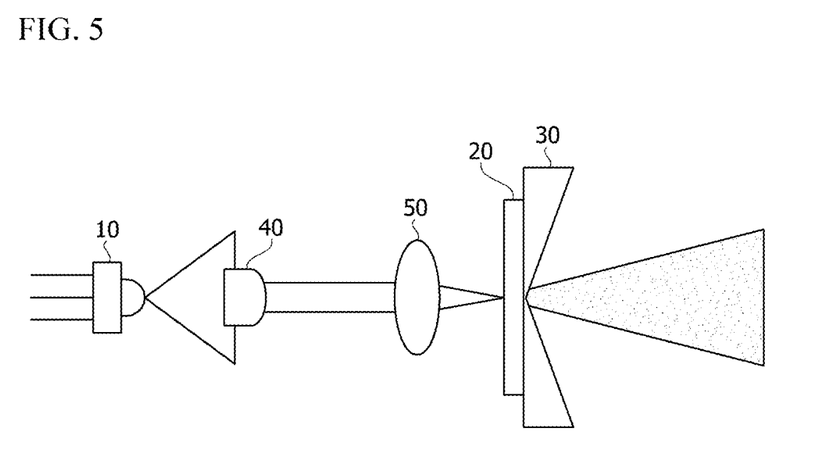
FIG. 5 is a conceptual view illustrating a lighting apparatus according to another embodiment of the present invention.

FIG. 5 is a conceptual view illustrating a lighting apparatus according to another embodiment of the present invention.

Referring to FIG. 5, the lighting apparatus according to another embodiment of the present invention may include a light source 10 configured to generate laser beams, a light converter 20 disposed in a direction in which the laser beams are emitted and configured to generate converted beams excited by the laser beams, a light housing 30 disposed in front of the light converter 20, having an opening along a path of beam travel, and configured to adjust a light distribution of the converted beams, a collimator 40 disposed between the light source 10 and the light converter 20 and configured to emit laser beams as parallel beams, and a light collector 50 disposed between the collimator 40 and the light converter 20 and configured to collect the parallel beams.

The collimator 40 is an objective lens for collimating laser beams, which are emitted from the light source, to be parallel to an axis of the lens and output the laser beams toward the light converter 20.

The light collector 50 may refract laser beams which passed through the collimator 40 to allow the laser beams to be incident on the light converter 20. The light collector 50 may include a collecting lens and allow laser beams incident as parallel beams to be refracted in a direction of a center of the light converter 20 and be incident on the light converter 20.

As described above, a lighting apparatus according to one embodiment of the present invention can improve a color deviation by adjusting a light distribution region of converted beams converted by a phosphor.

In addition, a lighting apparatus according to one embodiment of the present invention can adjust a radiation angle of white beams emitted therefrom.

While the present invention has been described above with reference to the embodiments, it should be understood by those skilled in the art that various modifications and alterations may be made without departing from the spirit and scope of the present invention described in the appended claims.

What is claimed is:

1. A lighting apparatus comprising:
a light source configured to generate laser beams;
a light converter disposed in a direction in which the laser beams are emitted and configured to emit first converted beams excited by the laser beams and laser beams transmitted through a phosphor layer, the light converter including:
a substrate,
a short wavelength filter disposed on the substrate,
the phosphor layer being disposed on the short wavelength filter, the phosphor layer converting incident laser beams into beams in a yellow wavelength range to generate the first converted beams, the first converted beams being combined with the laser beams transmitted through the phosphor layer to form second converted beams, wherein the second converted beams comprise beams in a blue wavelength range transmitted through the light converter to form a light distribution region according to a Gaussian distribution, and the first converted beams converted by the phosphor layer form a light distribution region according to a Lambertian distribution, and
a mold layer disposed on the short wavelength filter along peripheries of the phosphor layer; and
a light housing disposed on the light converter, the light housing having an opening along a path of beam travel, and being configured to adjust a light distribution of the second converted beams emitted by the light converter, the light housing blocking a portion of the first converted beams, the blocked portion being outside an overlap region comprised of the Gaussian light distribution region and the Lambertian light distribution region.

2. The lighting apparatus as set forth in claim 1, the opening having a trapezoidal shaped cross section, a short side of the trapezoidal shaped cross section being adjacent the phosphor layer.

3. The lighting apparatus as set forth in claim 2, an inclination angle of the non-parallel sides of the trapezoidal shape is in a range of 15° to 45° with respect to the phosphor layer.

4. The lighting apparatus as set forth in claim 1, wherein the second converted beams comprise beams in a blue wavelength range transmitted through the light converter to form a light distribution region according to a Gaussian distribution, and the first converted beams converted by the phosphor layer form a light distribution region according to a Lambertian distribution.

5. The lighting apparatus as set forth in claim 1, further comprising an adhesive layer disposed between the short wavelength filter and the phosphor layer.

6. The lighting apparatus as set forth in claim 1, further a collimator disposed between the light source and the light converter and configured to emit the laser beams as parallel beams.

7. The lighting apparatus as set forth in claim 6, further comprising a light collector disposed between the collimator and the light converter and configured to collect the parallel beams.

8. A lighting apparatus comprising:
a light source configured to generate laser beams;
a light converter disposed in a direction in which the laser beams are emitted and configured to emit first converted beams excited by the laser beams and laser beams transmitted through a phosphor layer, the light converter including:
a substrate,
a short wavelength filter disposed on the substrate,
the phosphor layer being disposed on the short wavelength filter, the phosphor layer converting incident laser beams into beams in a yellow wavelength range to generate the first converted beams, the first converted beams being combined with the laser beams transmitted through the phosphor layer to form second converted beams, and
a mold layer disposed on the short wavelength filter along peripheries of the phosphor layer; and
a light housing disposed on the light converter, the light housing having an opening along a path of beam travel, and being configured to adjust a light distribution of the second converted beams emitted by the light converter, wherein a diameter of the opening of the light housing increases in a direction in which the first converted beams and the transmitted beams are emitted through a first opening to a second opening,
wherein a cross-sectional area of the phosphor layer is larger than a cross-sectional area of the first opening of the light housing, and the cross-sectional area of the phosphor layer is smaller than a cross-sectional area of the second opening of the light housing,
wherein a cross-sectional area of the short wavelength filter is larger than the cross-sectional area of the second opening of the light housing, and
wherein a cross-sectional area of the light housing is larger than the cross-sectional area of the short wavelength filter, wherein a ratio of an incident area of the laser beams incident on the phosphor layer to the diameter of the first opening is 1:3.75.

* * * * *